(12) United States Patent
Hammerbacher et al.

(10) Patent No.: US 7,312,097 B2
(45) Date of Patent: *Dec. 25, 2007

(54) METHOD OF FABRICATING AN OPTICAL CONCENTRATOR FOR A PHOTOVOLTAIC SOLAR CELL

(75) Inventors: Milfred D Hammerbacher, Waterloo (CA); Gary D Stevens, Kitchener (CA); Paul R Sharrock, Cambridge (CA); Aline Wullur, Kitchener (CA); Frederic Rivollier, Kitchener (CA)

(73) Assignee: Spheral Solar Power, Inc., Cambridge, Ontario (CA)

( * ) Notice: Subject to any disclaimer, the term of this patent is extended or adjusted under 35 U.S.C. 154(b) by 98 days.

This patent is subject to a terminal disclaimer.

(21) Appl. No.: 11/135,080

(22) Filed: May 23, 2005

(65) Prior Publication Data

US 2005/0217721 A1 Oct. 6, 2005

Related U.S. Application Data

(63) Continuation of application No. 10/348,253, filed on Jan. 21, 2003, now Pat. No. 6,897,085.

(51) Int. Cl.
*H01L 21/00* (2006.01)
(52) U.S. Cl. ................... 438/63; 438/73; 438/98
(58) Field of Classification Search ............ 438/63, 438/73, 98; 257/446, 459; 136/244–250
See application file for complete search history.

(56) References Cited

U.S. PATENT DOCUMENTS

| | | | |
|---|---|---|---|
| 3,025,335 A | 3/1962 | Ralph | 136/89 |
| 4,361,598 A | 11/1982 | Yoldas | 427/74 |
| 4,610,077 A | 9/1986 | Minahan et al. | 29/572 |
| 4,909,856 A | 3/1990 | Ralph | 136/256 |
| 4,957,601 A | 9/1990 | Levine et al. | 156/665 |
| 5,081,069 A | 1/1992 | Parker et al. | |
| 5,360,491 A | 11/1994 | Carey et al. | 136/256 |
| 5,482,568 A | 1/1996 | Hockaday | 136/246 |
| 5,486,494 A | 1/1996 | Hotchkiss et al. | |

(Continued)

FOREIGN PATENT DOCUMENTS

EP 1 255 303 11/2002

(Continued)

OTHER PUBLICATIONS

Russell R. Schmit, et al., "The Effect of Silicon Purity on Spheral Solar Cell Processing and Performance".

(Continued)

*Primary Examiner*—Dung A. Le
(74) *Attorney, Agent, or Firm*—Baker & Daniels LLP

(57) ABSTRACT

A method of fabricating a photovoltaic solar cell is provided. A plurality of generally spherical semiconductor elements are provided. Each of the semiconductor elements has a core and an outer surface surface forming a p-n junction. An anti-reflection coating is deposited on the outer surface of each of the semiconductor elements and each of the semiconductor elements is bonded into a perforated aluminum foil array thereby providing ohmic contact to a first side of the p-n junction. The anti-reflection coating is removed from a portion of each of the semiconductor elements and then the core is exposed, thereby allowing ohmic contact to be made to a second side of the p-n junction.

39 Claims, 5 Drawing Sheets

U.S. PATENT DOCUMENTS

| | | |
|---|---|---|
| 5,498,576 A | 3/1996 | Hotchkiss et al. |
| 5,698,451 A | 12/1997 | Hanoka |
| 5,785,768 A | 7/1998 | Nakata .................. 136/250 |
| 6,156,967 A | 12/2000 | Ralph et al. ............ 136/244 |
| 6,188,012 B1 | 2/2001 | Ralph .................... 136/246 |
| 6,198,037 B1 | 3/2001 | Nakata .................. 136/246 |
| 6,204,545 B1 | 3/2001 | Nakata .................. 257/459 |
| 6,294,723 B2 | 9/2001 | Uematsu et al. ........ 136/246 |
| 6,294,822 B1 | 9/2001 | Nakata .................. 257/461 |
| 6,329,296 B1 | 12/2001 | Ruby et al. ............. 438/712 |
| 6,355,873 B1 | 3/2002 | Ishikawa ................ 136/250 |
| 6,407,327 B1 | 6/2002 | Ralph et al. ............ 136/244 |
| 6,897,085 B2 * | 5/2005 | Hammerbacher et al. ..... 438/63 |
| 2002/0023675 A1 | 2/2002 | Fukui et al. ............ 136/250 |
| 2002/0096206 A1 | 7/2002 | Hamakawa et al. ..... 136/244 |
| 2002/0096207 A1 | 7/2002 | Asai et al. .............. 136/244 |

OTHER PUBLICATIONS

John K. Arch, et al., "Characterization of Silicon Spheres for Spheral Solar Cells".

David C. Wong, et al., "The Effect of Annealing and Oxidation on APCVD TIOx Film and its Impact on the Process of Silicon Solar Cells", date is unknown.

First Tehnical Summary Report Covering the Period Oct. 1, 1959 to Dec. 31, 1959, "Investigation on Large Area Solar Cells Utilizing Spheres of Silicon" by Heinz F. Biekofsky.

Second Technical Summary Report Covering the Period Jan. 1, 1960 to Jun. 30, 1960, "Investigation on Large Area Solar Cells Utilizing Spheres of Silicon" by Eugene L. Ralph, et al.

Werner Kern, et al., "Titanium Dioxide Antireflection Coating for Silicon Solar Cells by Spray Deposition", Reprinted from RCA Review vol. 41, No. 2, Jun. 1980.

C.J. Brinker, et al., "Sol-Gel Derived Antireflective Coatings for Silicon" Solar Energy Materials 5 (1981) 159-172.

Joseph L. Keddie, et al. "Effect of Heating Rate on the Sintering of Titanium Dioxide Thin Films: Competition between Densification and Crystallization", Department of Materials Science and Engineering, Cornell University, Ithica, New York, date is unknown.

K.A. Vorotilov, et al., "Sol-gel TiO2 Films on Silicon Substrates", Moscow Institute of Radioengineering, Electronics and Automation, Vernadsky Prosp. 78, Moscow, date is unknown.

* cited by examiner

METHOD OF FABRICATING AN OPTICAL CONCENTRATOR FOR A PHOTOVOLTAIC SOLAR CELL

CROSS REFERENCE TO RELATED APPLICATIONS

This is a continuation of U.S. patent application Ser. No. 10/348,253 filed on Jan. 21, 2003, entitled METHOD OF FABRICATING AN OPTICAL CONCENTRATOR FOR A PHOTOVOLTAIC SOLAR CELL, now U.S. Pat. No. 6,897,085 the disclosure of which is hereby incorporated by reference.

FIELD OF THE INVENTION

The present invention relates in general to anti-reflection coatings for spheral solar cells and more particularly to the deposition of anti-reflection coatings on substantially spherical semiconductor elements of a spheral solar cell.

BACKGROUND OF THE INVENTION

Anti-reflection coatings are used in solar cells to increase absorption of incident light and thereby increase the output and efficiency of the solar cell. Flat solar cell designs have been widely used and anti-reflection coating processes for such designs are well known. In prior art processes, anti-reflection coatings are applied by chemical vapor deposition.

Recent solar cell advances have resulted in the use of substantially spherical silicon in a solar cell array, referred to as a spheral solar cell. Each of several silicon spheres is embedded in an aluminum foil such that only a hemispherical surface is exposed to receive incident light while the aluminum foil serves to reflect light to the silicon spheres.

The aluminum foil surface is advantageous for reflecting light to the silicon spheres which are coated with an antireflective coating on the silicon spheres. Thus, the light received by the spheres includes light reflected from the aluminum foil. However, anti-reflection coating that is deposited on the aluminum foil as a result of coating of the silicon spheres reduces the light reflected to the silicon spheres. This results in a decrease in incident light on the silicon spheres resulting in decreased output and efficiency of the solar cell.

One particular spheral solar cell array and a method of fabricating the solar cell array are disclosed in U.S. patent application Ser. No. 09/988,988 (publication no. U.S. 2002/0096206 A1), published Jul. 25, 2002. This application teaches a plurality of substantially spherical photoelectric conversion elements, each element being mounted in each of a plurality of recesses of a support for reflecting light to the elements. The elements include an n-type amorphous silicon covered with a p-type amorphous SiC layer, forming a p-n junction. The recesses are hexagonally shaped in a hexagonal array and the elements are mounted in respective openings in the hexagonal recesses such that the p-type amorphous SiC layer contacts the support and part of the elements extend through the support. Mechanical grinding of the parts of the elements that extend through the support exposes the n-type amorphous silicon. This particular solar cell array suffers from disadvantages, however, in that there is no anti-reflection coating to reduce the light reflected from the elements.

U.S. Pat. No. 6,355,873 discloses a spheral solar cell array of a plurality of substantially spherical photoelectric conversion elements including an p-type material covered by an n-type material. The elements are pressed into a wire mesh such that the wire mesh contacts the n-type material and each element is polished to remove a portion thereof and expose the p-type material. The elements, embedded in the wire mesh, are mounted in concave dimples of a dimpled sheet of aluminum foil such that a leg in each dimple contacts the p-type material. Again, this solar cell array does not include an anti-reflection coating to reduce the light reflected from the elements. Furthermore, this solar cell array must be manufactured such that contact between each leg and the n-type material of each of the elements is avoided.

One prior art method of applying an anti-reflection coating to a spheral solar cell is disclosed in U.S. Pat. No. 5,081,069, issued Jan. 14, 1992 to Parker et al. The anti-reflection coating is applied to the silicon spheres in a chemical vapor deposition (CVD) reactor chamber by introducing heated titanium isopropoxide into the CVD reactor chamber at atmospheric pressure, through reactor nozzles. This method relies on controlled decomposition of metal alkoxide with the aim of providing a uniform coating of metal oxide (titanium dioxide). This method suffers from many disadvantages, however. For example, metal oxide is not substantially uniformly deposited on the surface of the silicon spheres, resulting in a relatively thick layer of anti-reflection coating at the top of the silicon spheres and a relatively thin layer of anti-reflection coating on the underside of the silicon spheres. Also, densification of the coating to achieve desirable refractive indices is limited to temperatures below about 577 degrees Celsius. Higher temperatures lead to undesirable formation of aluminum silicide liquid phases at the aluminum-silicon bond, thereby degrading the finished cell.

It is therefore desirable to provide a method of fabricating a photovoltaic solar cell, that obviates or mitigates at least some of the disadvantages of the prior art.

SUMMARY OF THE INVENTION

In one aspect, there is provided a method of fabricating an optical concentrator for a photovoltaic solar cell. The method includes providing a plurality of generally spherical semiconductor elements. Each of the semiconductor elements has a core and an outer surface forming a p-n junction. An anti-reflection coating is deposited on the outer surface of each of the semiconductor elements and each of the semiconductor elements is bonded into a perforated aluminum foil array thereby providing ohmic contact to a first side of the p-n junction. The anti-reflection coating is removed from a portion of each of the semiconductor elements and then the core is exposed, thereby allowing ohmic contact to be made to a second side of the p-n junction.

In another aspect of the present invention there is provided a method of fabricating an optical concentrator for a photovoltaic solar cell. The method includes providing a plurality of generally spherical semiconductor elements. Each of the semiconductor elements include p and n type semiconductor materials forming a p-n junction within each the semiconductor element. An anti-reflection coating is deposited on an outer surface of each of the semiconductor elements. Each of the semiconductor elements is bonded into a perforated aluminum foil array such that a portion of each of the semiconductor elements extends through the perforated aluminum foil array and ohmic contact is provided between the aluminum foil and one of the p and n type semiconductor materials. The anti-reflection coating is removed from the portion of the semiconductor elements and then the other of the p and n type materials is exposed.

In yet another aspect, there is provided a method of fabricating an optical concentrator for a photovoltaic solar cell. The method includes providing a hexagonal array of substantially spherical depressions in a perforated aluminum foil. A generally spherical semiconductor element having p and n type semiconductor materials forming a p-n junction, and an anti-reflection coating on an outer surface of the semiconductor element, is bonded into the perforated aluminum foil such that a portion of the semiconductor element extends through the perforated aluminum foil and ohmic contact is provided between the aluminum foil and one of the p and n type semiconductor materials. The anti-reflection coating is removed from the portion of the semiconductor element and then the other of the p and n type materials is exposed.

Advantageously, the semiconductor elements are coated prior to bonding in the aluminum foil. Thus, anti-reflection coating is not deposited on the aluminum foil. Also, a substantially uniform thickness of anti-reflection coating on the surface of each of the semiconductor elements is achieved. Further, the thickness of the anti-reflection coating is controllable to provide coatings of various desired thicknesses. Thus, semiconductor elements of any one of a variety of colours can be produced.

BRIEF DESCRIPTION OF THE DRAWINGS

The invention will be better understood with reference to the following drawings, and the following description in which.

DETAILED DESCRIPTION OF THE PREFERRED EMBODIMENTS

A method of fabricating a photovoltaic solar cell according to a first embodiment of the present invention will now be described. A plurality of generally spherical semiconductor elements are used. Each of the semiconductor elements has a core and an outer surface of a layer of doped silicon forming a p-n junction below the layer of doped silicon. An anti-reflection coating is deposited on the outer surface of each of the semiconductor elements and the semiconductor elements are bonded into a perforated aluminum foil array, thereby providing ohmic contact to a first side of the p-n junction. The anti-reflection coating is then removed from a portion of each of the semiconductor elements in the array and then the core is exposed, thereby allowing ohmic contact to be made to a second side of the p-n junction.

The method of fabricating a photovoltaic solar cell will now be more fully described. The semiconductor elements described herein are referred to generally as spherical semiconductor elements, although other shapes are possible. It will be understood that each of the semiconductor elements has a core and an outer surface forming a p-n junction below the outer surface.

The semiconductor elements are coated with a titanium dioxide anti-reflection coating by chemical vapor deposition (CVD) of the titanium dioxide on the outer surface of the semiconductor elements within a CVD reactor. Decomposition of source vapors of titanium isopropoxide by reaction with oxygen, at elevated temperature, near the surface of the semiconductor elements results in the deposition of titanium dioxide ($TiO_2$). The oxygen source is introduced above the semiconductor elements. The nozzle that introduces the titanium isopropoxide to the CVD reactor is heated to a temperature of from about 100° C. to about 175° C. and preferably to about 150° C., to increase the gas temperature to a temperature near the reaction temperature. The semiconductor elements are also heated to a temperature in the range of about 200° C. to about 500° C., and preferably to about 250° C., to aid in decomposition of the titanium isopropoxide. The semiconductor elements are continuously moved through the deposition area during deposition in order to provide a generally uniform coating of desired thickness.

Figure 1:
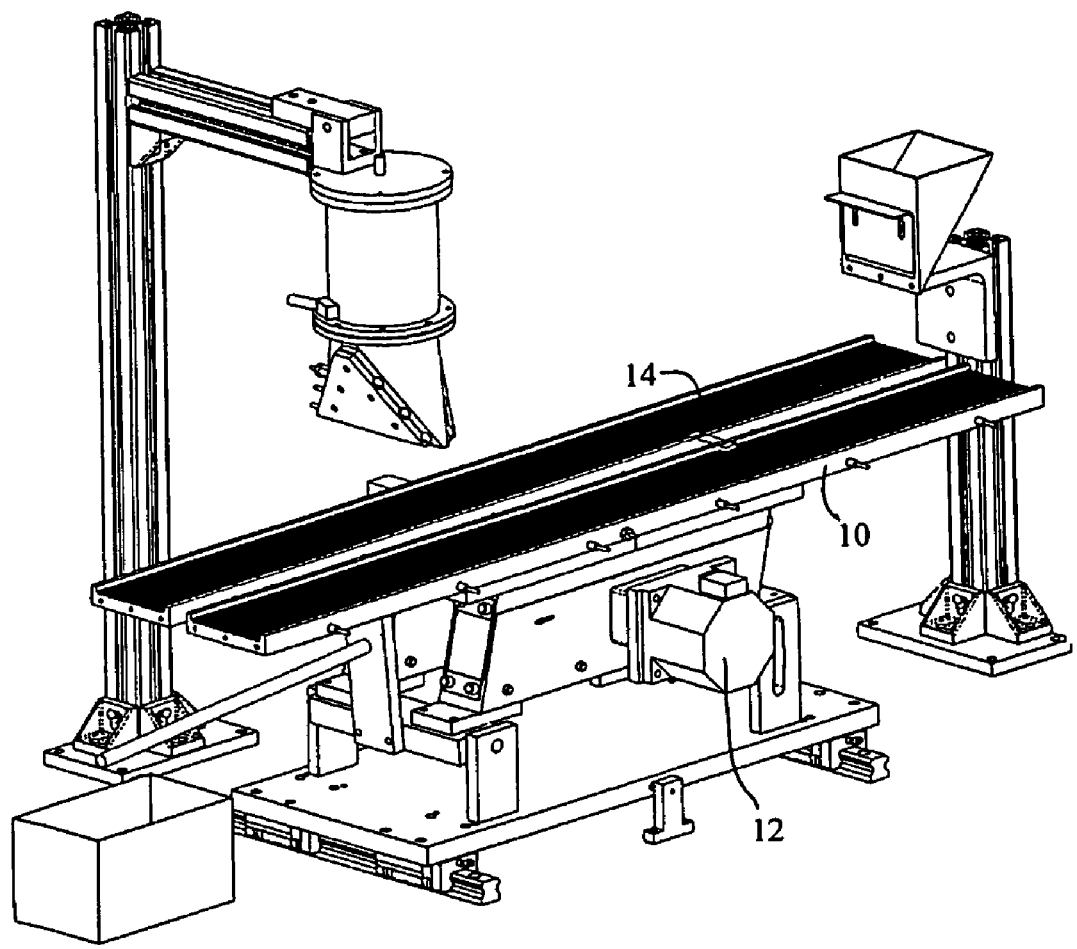
FIG. 1 shows a perspective view of a vibratory tray employed to continuously move the semiconductor elements through a deposition zone, according to an aspect of an embodiment of the present invention.

Referring to FIG. 1, a vibratory tray 10 is employed to continuously move the semiconductor elements through the deposition zone. A tray vibrator drive 12 is attached to a tray and a heating mantle 14 is provided for preheating the semiconductor elements. The desired thickness and uniformity of the coating is achieved by multiple passes of the semiconductor elements through the vibratory tray 10. A generally uniform coating thickness of about 600 to about 900 angstroms is desirable and is achieved by passing the semiconductor elements through the vibratory tray 10 about three times to deposit from about 200 angstroms to about 300 angstroms of titanium dioxide per pass. A titanium dioxide coating thickness of about 600 to about 800 angstroms provides a dark blue coating of ¼ wavelength for good anti-reflection performance. Other colours can be effected by varying the thickness of the anti-reflection coating, thereby varying the wavelength, at the cost of reduced anti-reflection efficiency. Appendix A includes a table showing the thickness of titanium dioxide anti-reflection coating and the resulting colours effected.

Figure 2:
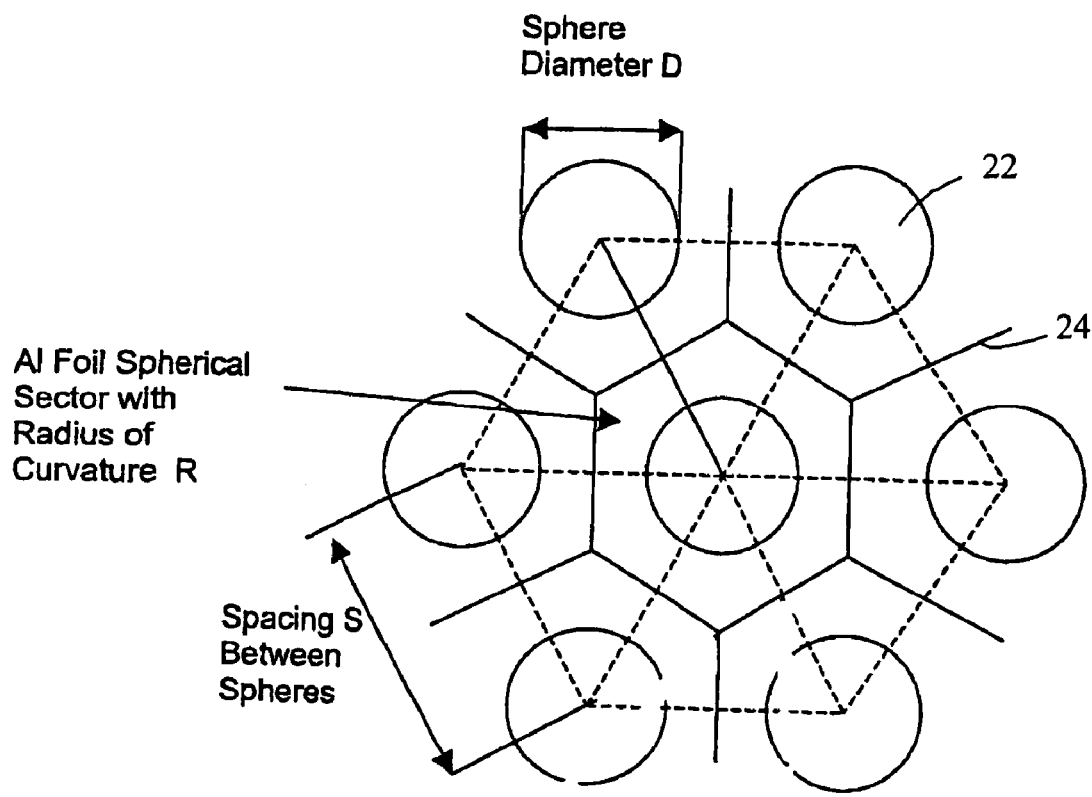
FIG. 2 shows a top view of an array of semiconductor elements in a periodic hexagonal array of optical concentrators, according to an embodiment of the present invention.
Figure 3:
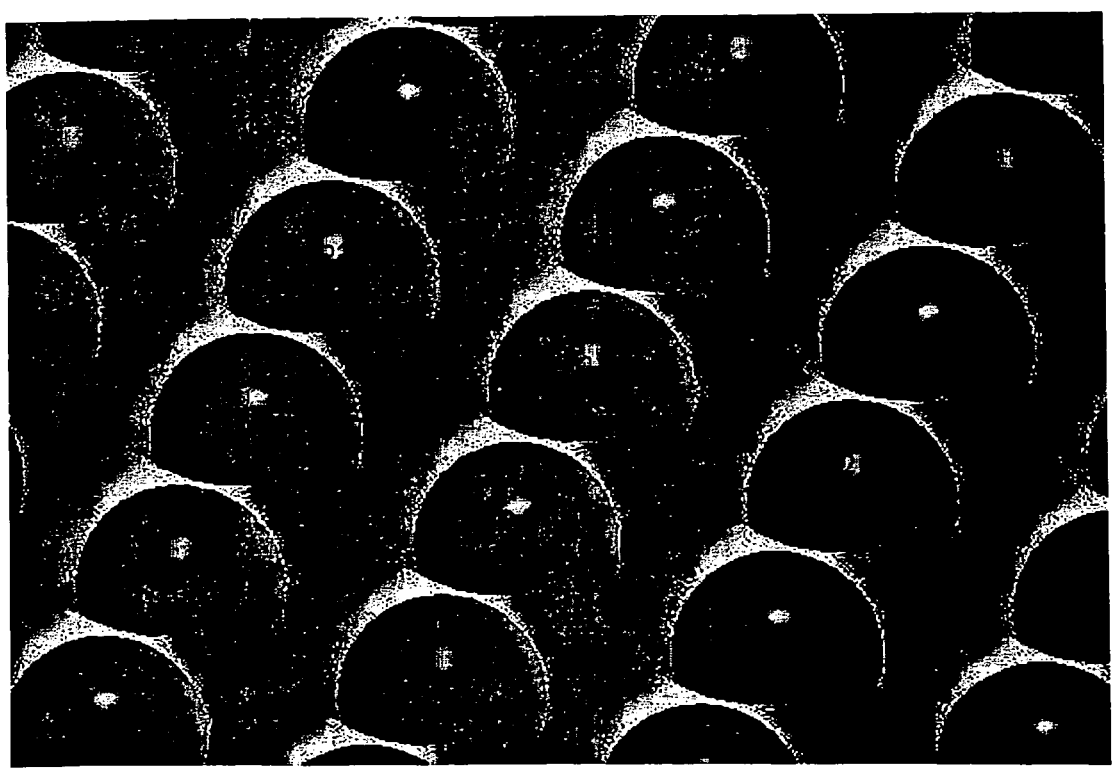
FIG. 3 shows a perspective view of the array of semiconductor elements in the periodic hexagonal array of optical concentrators of FIG. 2.

Reference is now made to FIGS. 2 and 3, which show a top view and a perspective view, respectively, of the array of semiconductor elements in a periodic hexagonal array of optical concentrators. The coated semiconductor elements 22 are bonded into the periodic hexagonal array of optical concentrators made of a perforated aluminum foil 24. The aluminum foil 24 has a thickness of about 0.075 mm (0.003 inches) to about 0.125 mm (0.005 inches). The hexagonal periodic array of optical concentrators is a hexagonal or honeycomb structure of a plurality of substantially spherical depressions in the aluminum foil 24. Each spherical depression has a radius of curvature R of, for example, 0.915 mm (0.036 inches). The aluminum foil 24 includes perforations or apertures for receiving the spherical semiconductor elements 22. Thus, the spacing S of the spherical semiconductor elements 22 is dependent on the spacing of the apertures in the aluminum foil 24.

Generally, each spherical semiconductor element 22 has a diameter D in the range of about 0.3 mm to about 0.9 mm and preferably in the range of about 0.6 mm (0.024 inches) to about 0.8 mm (0.032 inches). Each spherical semiconductor element 22 in a single cell has a similar nominal diameter. The spherical semiconductor elements 22 are mounted in the spherical depressions of the perforated aluminum foil 24, resulting in a spherical element spacing of S, as shown.

Figure 4A:
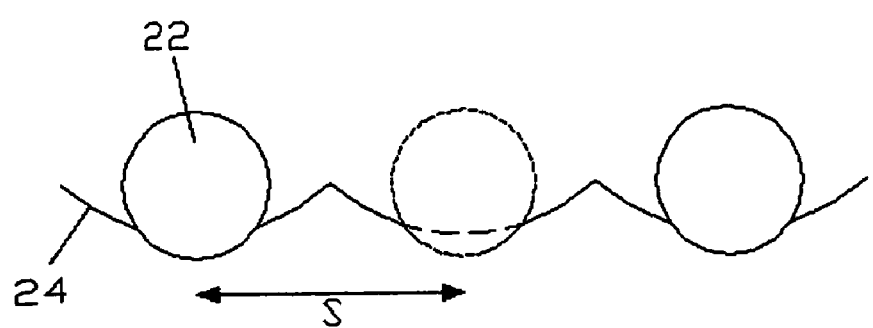
FIGS. 4A and 4B show the semiconductor elements mounted in a perforated foil of the optical concentrators of FIG. 2.
Figure 4B:
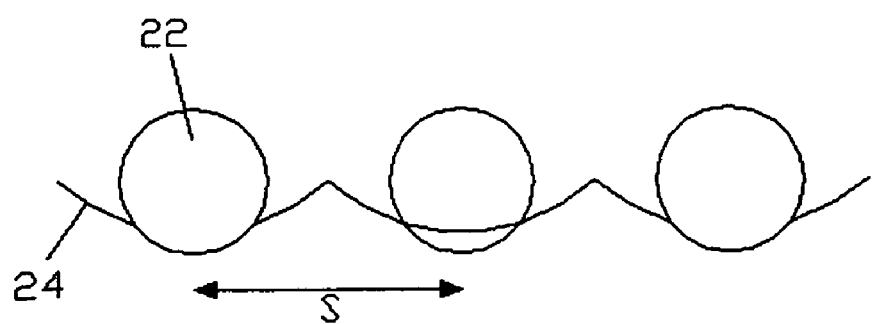

FIGS. 4A and 4B show the mounting of the spherical semiconductor elements 22 in the perforated aluminum foil 24. The spherical semiconductor elements 22 are loaded into the perforations in the aluminum foil 24. Next the elements 22 are bonded at a temperature less than the eutectic temperature for aluminum silicide formation (less than about 577° C.), and preferably in the range of about 540° C. to about 555° C., and a rolling mill force in the range of about 2500 lbs (1134 Kg) to about 3500 lbs force (1588 Kg) for each 10 mm of cell width, thereby dissolving the anti-reflection coating at a bond line of the semiconductor element 22 and the aluminum foil 24. Thus, an aluminum-silicon bond is formed between the foil 24 and the semiconductor element 22 to provide ohmic contact to the first side of the p-n junction.

Figure 5A:
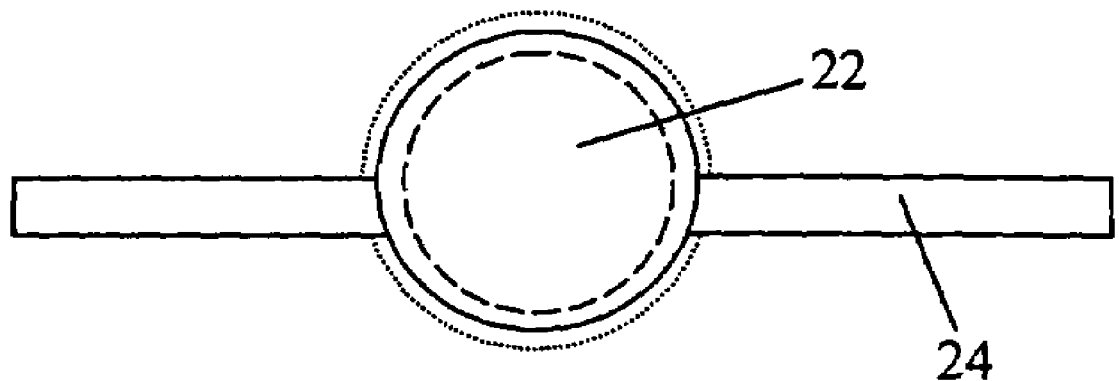
FIG. 5A shows one of the semiconductor elements mounted in the perforated aluminum foil of FIG. 4, prior to exposure of the second side of the p-n junction.
Figure 5B:
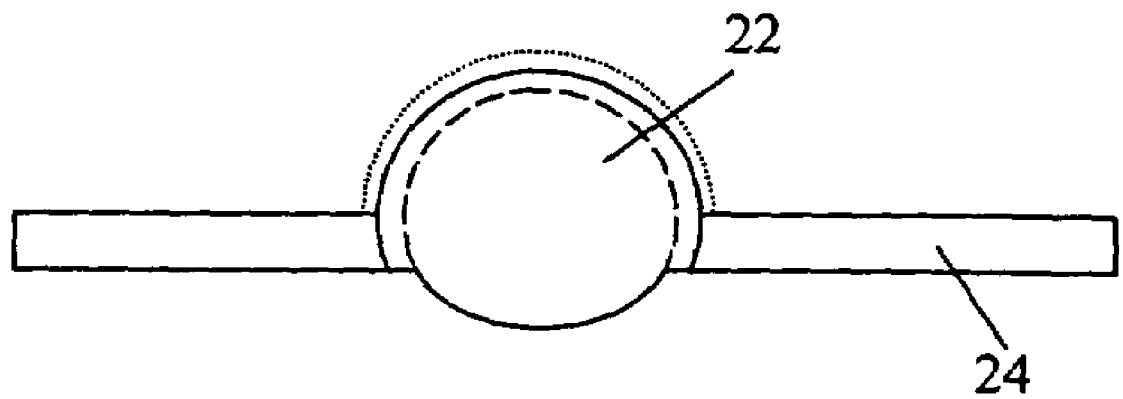
FIG. 5B shows the semiconductor element of FIG. 5A, with the second side of the p-n junction exposed.

Reference is now made to FIG. 5A which shows one of the semiconductor elements 22 mounted in the perforated aluminum foil 24, prior to exposure of the second side of the p-n junction. The anti-reflective coating is then removed from the backside of each of the semiconductor elements 22 by chemical etching. The backside of each of the semiconductor elements 22 is exposed to concentrated hydrofluoric acid by spraying the backside of each of the semiconductor elements with concentrated hydrofluoric acid to etch away the $TiO_2$. Alternatively, the backside is immersed in hydrofluoric acid or a paste with hydrofluoric acid and an inert carrier is applied to the backside. Next, the backside of each of the semiconductor elements is etched with a mixture of hydrofluoric acid and nitric acid to etch away the doped silicon layer of the semiconductor elements, as shown in FIG. 5B, and thereby allow for ohmic contact to be made to the second side of the p-n junction. The aluminum foil 24 serves as an etch mask during etching of the backside of the semiconductor elements 22. In an alternative embodiment, the backside of each of the semiconductor elements is etched with a caustic etchant such as NaOH, KOH, $NH_4OH$, etc, to etch away the doped silicon layer.

Other modifications and variations to the above-described embodiment are possible. In one variation, rather than multiple passes of the semiconductor elements down the vibratory tray 10, multiple deposition nozzles are used to achieve desired thickness and uniformity of coating in a single pass down the vibratory tray 10.

In another variation to the above-described embodiment, the semiconductor elements are loaded into a porous rotating drum rather than passing through a vibratory tray 10, for continuous movement to provide a generally uniform coating of desired thickness. In this embodiment, the source vapours, titanium isopropoxide, an oxygen source, and nitrogen are decomposed in the drum. In one aspect, the porous rotating drum is used for batch processing. In another aspect, the porous rotating drum is slightly tilted such that the semiconductor elements gradually pass through the drum due to gravity. It will be appreciated that this process is continuous rather than a batch process.

In still another variation to the embodiment described herein above, rather than using a vibratory tray 10, the semiconductor elements are continuously moved in a fluidized bed. The source vapours, titanium isopropoxide, the oxygen source, and nitrogen carrier gas are flowed through the bed to cause decomposition of the titanium isopropoxide in the bulk of the semiconductor elements. In another aspect, the fluidized bed is modified for continuous processing of semiconductor elements, rather than batch processing.

In accordance with another embodiment, the semiconductor elements are coated with a silicon nitride ($Si_3N_4$) anti-reflection coating by reactive gas decomposition, known as plasma enhanced chemical vapor deposition. In this embodiment, silane ($SiH_4$), or fluoro or chloro silane, is reacted with nitrogen or nitrogen containing gas, such as ammonia. Hydrogen plasma is used to catalyze the decomposition. The semiconductor elements are continuously moved during coating, and similar techniques to those already described in the first embodiment and the variation described above, can be employed to continuously move the elements. As described hereinabove, different colours can be effected by varying the thickness of the anti-reflection coating, thereby varying the wavelength. Similar colours to those in Appendix A for titanium dioxide, can be effected for the silicon nitride anti-reflection coating. To effect the same colours, the thickness of silicon nitride coating is determined by multiplying the given thickness for titanium dioxide, by 1.364.

The semiconductor elements are then mounted in the aluminum foil, in a similar manner to that described above. In this embodiment, however, rather than removing the anti-reflection coating from the backside of each of the semiconductor elements by etching with hydrofluoric acid and subsequent etching with a mixture of hydrofluoric and nitric acids, the backside of each of the semiconductor elements is subjected to mechanical or chemical-mechanical polishing. This process results in the removal of the anti-reflection coating along with the doped layer of silicon on the backside of each semiconductor element. In this variation, the source vapours, titanium isopropoxide, the oxygen source, and nitrogen are decomposed in the column.

In one variation, the semiconductor elements are continuously moved by packing the elements into a column and continuously removing semiconductor elements from the bottom of the column while feeding semiconductor elements to the top.

In accordance with yet another embodiment, the semiconductor elements are sputter coated to form a titanium dioxide anti-reflection coating. A sputtering target is employed to create a metal coating on the surfaces of the semiconductor elements and the surfaces are subsequently oxidized. Alternatively, titanium dioxide is directly deposited on the surface of the semiconductor elements. This is accomplished using either a titanium dioxide target or a titanium target that is oxidized on the surface. As in the above-described embodiments, the semiconductor elements are continuously moved during coating. It will be understood, however, that sputtering is performed in a vacuum to produce an anti-reflection coating and therefore the use of a fluidized bed is not suitable in the present embodiment. Other continuous movement techniques can be employed, however.

In one variation, the semiconductor elements are continuously moved using a rotating disk. The elements are introduced to the disk and rotate through almost 360 degrees. The elements are then swept off into a collection area.

In accordance with still another embodiment of the present invention, the semiconductor elements are coated using a modified sol-gel process. Using this approach, a small amount of gel solution of hydrolized metal alkoxide suspended in a solvent carrier is added to a plurality of semiconductor elements. The semiconductor elements are continually stirred to distribute the solution uniformly over the surfaces of the plurality of semiconductor elements and to evaporate the solvent. There are many suitable mixers including vibratory bowl de-burring machines, tumble mixers, and ball mills, for example.

Other modifications and variations are possible. For example, the size and shape of many of the features can vary. For example, an anti-reflection coating of silicon dioxide ($SiO_2$) can be employed. Similar colours to those in Appendix A for titanium dioxide, can be effected for the silicon dioxide anti-reflection coating. To effect the same colours, the thickness of silicon dioxide coating is determined by multiplying the given thickness for titanium dioxide, by 1.82. Still other modifications and variations are possible. All such modifications and variations are believed to be within the scope and sphere of the present invention.

What is claimed is:

1. A method of assembling a photovoltaic solar cell, said photovoltaic cell comprising a plurality of generally spherical semiconductor elements, each of said semiconductor elements having a core and an outer surface forming a p-n junction, said method comprising:
   depositing an anti-reflection coating on the outer surface of each of said semiconductor elements;
   placing each of said semiconductor elements into a respective perforation formed in a reflective, conductive substrate and bonding said semiconductor elements to said substrate thereby resulting in ohmic contact between a first side of the p-n junction of each semiconductor element and said substrate; and
   exposing the core of each of said semiconductor elements.

2. The method of claim 1, wherein said depositing an anti-reflection coating comprises depositing a metal oxide on the outer surface of each of the semiconductor elements.

3. The method of claim 2, wherein said depositing an anti-reflection coating comprises depositing titanium dioxide on the outer surface of each of the semiconductor elements.

4. The method of claim 2, wherein depositing a metal oxide on the outer surface of each of the semiconductor elements comprises decomposing at least one metal alkoxide in a chemical vapor deposition reactor.

5. The method of claim 4, wherein decomposing at least one metal alkoxide comprises decomposing at least one of titanium isopropoxide, titanium ethoxide, and a mixture thereof in a chemical vapor deposition reactor.

6. The method of claim 2 wherein depositing a metal oxide on the outer surface of each of the semiconductor elements comprises sputter deposition of a metal coating from a target, followed by oxidation of said metal coating.

7. The method of claim 2 wherein depositing a metal oxide on the outer surface of each of the semiconductor elements comprises hydrolizing a metal alkoxide in a sol-gel process and condensing said metal alkoxide on the outer surface of each of the semiconductor elements during continuous moving.

8. The method of claim 1, wherein said depositing an anti-reflection coating comprises depositing a non-oxide composition on the outer surface of each of the semiconductor elements.

9. The method of claim 8, wherein said depositing an anti-reflection coating comprises depositing silicon nitride on the outer surface of each of the semiconductor elements.

10. The method of claim 8, wherein depositing the non-oxide composition on the outer surface of each of the semiconductor elements comprises decomposing source gases.

11. The method of claim 10, wherein said decomposing source gases includes decomposing ammonia with a gas selected from the group silane, chiorosilane, fluorosilane, and any combination thereof.

12. The method of claim 10, wherein said decomposing source gases includes using reactive plasma.

13. The method of claim 10, wherein depositing the non-oxide composition comprises decomposing source gas using reactive plasma.

14. The method of claim 1, wherein said bonding comprises thermo-compression bonding each of said semiconductor elements to said substrate, dissolving said anti-reflection coating at a bond line of each of said semiconductor elements and forming a bond between the substrate and each of said semiconductor elements.

15. The method of claim 14 wherein said substrate is an aluminum foil and wherein thermo-compression bonding comprises thermo-compression bonding at a temperature less than the eutectic temperature for aluminum silicide formation.

16. The method of claim 14 wherein said thermo-compression bonding comprises thermo-compression bonding at a temperature less than 577° C.

17. The method of claim 1, wherein said exposing comprises subjecting each of said semiconductor elements to hydrofluoric acid.

18. The method of claim 17, wherein subjecting each of said semiconductor elements to hydrofluoric acid comprises at least one of spraying said semiconductor elements with a hydrofluoric acid, immersing said semiconductor elements in hydrofluoric acid, and applying a paste comprising hydrofluoric acid and an inert carrier to said semiconductor elements.

19. The method of claim 17, wherein said exposing comprises, prior to said subjecting, one of mechanical polishing and chemical-mechanical polishing.

20. The method of claim 1, wherein depositing said anti-reflection coating on the outer surface of each of the semiconductor elements further comprises continuous moving of said semiconductor elements by at least one of vibrating in trays, vibratory bowl tumbling, bowl tumbling, fluidized bed reacting, mechanical stirring, and a combination thereof to deposit a substantially uniform anti-reflection coating thickness of from about 600 to about 900 angstroms.

21. The method of claim 1, wherein depositing said anti-reflection coating on the outer surface of each of the semiconductor elements further comprises packing said semiconductor elements in a column and feeding source gases to said column to deposit a substantially uniform anti-reflection coating thickness of from about 600 to about 900 angstroms.

22. A method of assembling a photovoltaic solar cell comprising a plurality of generally spherical semiconductor elements, each of said semiconductor elements including p and n type semiconductor materials forming a p-n junction, said method comprising:
   depositing an anti-reflection coating on an outer surface of each of the semiconductor elements;
   bonding each of said semiconductor elements to a perforated aluminum foil such that a portion of each of said semiconductor elements extends through said perforated aluminum foil and ohmic contact is provided between said aluminum foil and one of said p and n type semiconductor materials; and on one side of said aluminum foil, for each semiconductor element, exposing the other of said p and n type semiconductor materials.

23. The method of claim 22, wherein said depositing comprises depositing a metal oxide on the outer surface of each of the semiconductor elements.

24. The method of claim 23, wherein said depositing comprises depositing titanium dioxide on the outer surface of each of the semiconductor elements.

25. The method of claim 23, wherein said depositing comprises sputter deposition of a metal coating from a target, followed by oxidation of said metal coating.

26. The method of claim 23, wherein said depositing comprises hydrolizing a metal alkoxide in a sol-gel process and condensing said metal alkoxide on the outer surface of each of the semiconductor elements during continuous moving.

27. The method of claim 22, wherein said depositing comprises depositing a non-oxide composition on the outer surface of each of the semiconductor elements.

28. The method of claim 27, wherein said depositing comprises depositing silicon nitride on the outer surface of each of the semiconductor elements.

29. The method of claim 27, wherein depositing the non-oxide composition on the outer surface of each of the semiconductor elements comprises decomposing a source gas selected from the group consisting of at least one of silane, chiorosilane, fluorosilane, and any combination thereof, with a nitrogen source.

30. The method of claim 29, wherein the nitrogen source is selected from the group consisting of ammonia and nitrogen.

31. The method of claim 22, wherein said bonding comprises thermo-compression bonding each of said semiconductor elements to said perforated aluminum foil, dissolving said anti-reflection coating at a bond line of each of said semiconductor elements and forming an aluminum-silicon bond between the foil and each of said semiconductor elements.

32. The method of claim 31 wherein said thermo-compression bonding comprises thermo-compression bonding at a temperature less than the eutectic temperature for aluminum silicide formation.

33. The method of claim 22, wherein said exposing comprises at least one of subjecting each of said semiconductor elements to a mixture of hydrofluoric acid and nitric acid, subjecting each of said semiconductor elements to a caustic etchant, mechanical polishing each of said semiconductor elements, and chemical-mechanical polishing each of said semiconductor elements.

34. The method of claim 22, wherein depositing an anti-reflection coating comprises continuous moving of said semiconductor elements by at least one of vibrating in trays, vibratory bowl tumbling, bowl tumbling, fluidized bed reacting, mechanical stirring, and a combination thereof to deposit a substantially uniform anti-reflection coating thickness of from about 600 to about 900 angstroms.

35. The method of claim 22 wherein depositing an anti-reflection coating comprises packing said semiconductor elements in a column and feeding source gases to said column to deposit a substantially uniform anti-reflection coating thickness of from about 600 to about 900 angstroms.

36. A method of assembling a photovoltaic solar cell comprising a reflective, conductive substrate having an array of hexagonal depressions therein and a plurality of generally spherical semiconductor elements, each of said semiconductor elements including p and n type semiconductor materials forming a p-n junction, and an anti-reflection coating on an outer surface thereof, said method comprising:

bonding each semiconductor element to said substrate in a respective one of said depressions such that a portion of said semiconductor element extends through said substrate and ohmic contact is provided between the substrate and one of the p and n type semiconductor materials; and exposing, on one side of said substrate, the other of said p and n type semiconductor materials of each of said semiconductor elements.

37. The method of claim 36, wherein said bonding comprises thermo-compression bonding said semiconductor element to said substrate dissolving said anti-reflection coating at a bond line of each of said semiconductor elements and forming a bond between the substrate and each of said semiconductor elements.

38. The method of claim 37 wherein said substrate is an aluminum foil and wherein said thermo-compression bonding comprises thermo-compression bonding at a temperature less than the eutectic temperature for aluminum silicide formation.

39. The method of claim 36, wherein said exposing comprises at least one of subjecting each of said semiconductor elements to a mixture of hydrofluoric acid and nitric acid, subjecting each of said semiconductor elements to a caustic etchant, mechanical polishing each of said semiconductor elements, and chemical-mechanical polishing each of said semiconductor elements.

* * * * *

UNITED STATES PATENT AND TRADEMARK OFFICE
CERTIFICATE OF CORRECTION

PATENT NO.         : 7,312,097 B2                                              Page 1 of 1
APPLICATION NO. : 11/135080
DATED              : December 25, 2007
INVENTOR(S)        : Milfred D. Hammerbacher et al.

It is certified that error appears in the above-identified patent and that said Letters Patent is hereby corrected as shown below:

Claim 29, Column 9, Line 29, delete "chiorosilane" and insert --chlorosilane--

Signed and Sealed this

Seventeenth Day of June, 2008

JON W. DUDAS
*Director of the United States Patent and Trademark Office*